(12) United States Patent
Buck et al.

(10) Patent No.: US 9,316,664 B2
(45) Date of Patent: Apr. 19, 2016

(54) HIGH FREQUENCY DISTURBANCE DETECTION AND COMPENSATION

(75) Inventors: Timothy Merrill Buck, Oakdale, MN (US); Lawrence Charles Vallot, Lake Elmo, MN (US)

(73) Assignee: Honeywell International Inc., Morris Plains, NJ (US)

( * ) Notice: Subject to any disclaimer, the term of this patent is extended or adjusted under 35 U.S.C. 154(b) by 919 days.

(21) Appl. No.: 13/585,453

(22) Filed: Aug. 14, 2012

(65) Prior Publication Data
US 2016/0077125 A1    Mar. 17, 2016

(51) Int. Cl.
*H03B 1/00* (2006.01)
*G01P 15/00* (2006.01)

(52) U.S. Cl.
CPC ......... *G01P 15/00* (2013.01); *H03B 2200/0088* (2013.01)

(58) Field of Classification Search
USPC ........................................... 327/552; 375/346
See application file for complete search history.

(56) References Cited

U.S. PATENT DOCUMENTS

| | | | |
|---|---|---|---|
| 5,050,087 A | 9/1991 | Walrath et al. | |
| 6,114,988 A | 9/2000 | Schipper et al. | |
| 6,498,996 B1 | 12/2002 | Vallot | |
| 6,959,259 B2 | 10/2005 | Vock et al. | |
| 7,158,912 B2 | 1/2007 | Vock et al. | |
| 7,421,343 B2 | 9/2008 | Hawkinson | |
| 7,840,381 B2 | 11/2010 | Lund et al. | |
| 2002/0026283 A1 | 2/2002 | Tucker et al. | |
| 2005/0286791 A1* | 12/2005 | Katohgi | H04N 1/409 382/252 |
| 2008/0077325 A1 | 3/2008 | Bye et al. | |
| 2008/0140316 A1 | 6/2008 | Masson | |
| 2009/0302935 A1* | 12/2009 | Iwata | H04L 27/06 329/300 |
| 2010/0121601 A1 | 5/2010 | Eckert | |
| 2010/0174502 A1 | 7/2010 | Thompson et al. | |
| 2011/0051855 A1* | 3/2011 | Shibata | H04L 7/042 375/340 |
| 2011/0257927 A1 | 10/2011 | Bharadwaj et al. | |
| 2012/0136604 A1 | 5/2012 | Hsieh et al. | |
| 2012/0302186 A1* | 11/2012 | Jones | H03F 1/0227 455/127.1 |

FOREIGN PATENT DOCUMENTS

| | | |
|---|---|---|
| CN | 101788679 | 7/2010 |
| EP | 1837627 | 9/2007 |

OTHER PUBLICATIONS

Chan et al., "Sensor data fusion for attitude stabilization in a low cost Quadrotor system", "15th International Symposium on Consumer Electronics", Jun. 2011, pp. 1-6, Publisher: IEEE.

(Continued)

*Primary Examiner* — Hussein A. Elchanti
(74) *Attorney, Agent, or Firm* — Fogg & Powers LLC (57) ABSTRACT

A disturbance correction device comprises a disturbance detector configured to detect and output a high frequency component of a measurement signal from an inertial sensor and a level converter coupled to the output of the disturbance detector. The level converter is configured to convert the high frequency component to a direct current (DC) signal. The disturbance correction device also comprises a compensator coupled to an output of the level converter and configured to compare the DC signal with a plurality of thresholds. When the DC signal passes one of the plurality of thresholds, the compensator is further configured to output a respective process noise increment to a Kalman filter. The respective process noise increment corresponds to the passed threshold.

14 Claims, 9 Drawing Sheets

(56) References Cited

OTHER PUBLICATIONS

Guarnieri et al., "Low Cost System: GPS/MEMS for Positioning", "Development in GNSS Measurement Technologies and Techniques", Jun. 2008, pp. 1-10.

Weidong Ding, "Optimal Integration of GPS with Inertial Sensors: Modelling and Implementation", Mar. 2008, pp. 1-161.
GB Intellectual Property Office, "Combined Search and Examination Report", "from Foreign Counterpart of U.S. Appl. No. 13/585,453", Nov. 12, 2013, pp. 1-5, Published in: GB.

* cited by examiner

HIGH FREQUENCY DISTURBANCE DETECTION AND COMPENSATION

GOVERNMENT LICENSE RIGHTS

This invention was made with Government support under FA8678-10-C-0058 awarded by United States Air Force. The Government has certain rights in the invention.

BACKGROUND

Inertial sensors such as gyroscopes and accelerometers are used in a variety of applications for measuring motion in vehicle navigation, in oil field drilling, and so on. These inertial sensors are often inside an inertial navigation system (INS) and then combined with yet other instruments such as a Global Positioning System (GPS) that are mounted on a vehicle such as an aircraft. The raw GPS/INS calculation of the aircraft's position, velocity, attitude, etc., may be corrected through Kalman filtering. The filter estimates errors by fusing the raw data and uncertainties from the various instruments that measure position, velocity, attitude, and heading. There may be uncertainties and errors for the raw measurements from the gyroscopes and accelerometers. Even the relatively precise GPS measurements may have some uncertainties and errors.

The errors estimated by a Kalman filter may be due to artifacts. For example, when external disturbances affect the aircraft due to turbulence or acoustic noise (e.g. explosion) or internal disturbances due to electronics issues, these disturbances may cause the instruments such as the accelerometer to realize larger DC bias offset values and/or rapid changes in the DC bias values. Then the Kalman filter that estimates the errors may produce shifted results for a period of time. During, and for some time after the disturbance, the Kalman filter is still governed by the small error uncertainties that it estimated prior to the disturbance and therefore may assign artificially small errors to states associated with the disturbance. Accordingly, the Kalman filter will continue for some time duration to over-weight the raw data garnered during the disturbance, and produce a poor estimate of the state solution. Moreover, because the Kalman filter is operating on a plurality of inputs, the Kalman filter might not know which parameters are most affected and require correction.

SUMMARY

In one embodiment, a disturbance correction device is provided. The disturbance correction device comprises a disturbance detector configured to detect and output a high frequency component of a measurement signal from an inertial sensor and a level converter coupled to the output of the disturbance detector. The level converter is configured to convert the high frequency component to a direct current (DC) signal. The disturbance correction device also comprises a compensator coupled to an output of the level converter and configured to compare the DC signal with a plurality of thresholds. When the DC signal passes one of the plurality of thresholds, the compensator is further configured to output a respective process noise increment to a Kalman filter. The respective process noise increment corresponds to the passed threshold.

DRAWINGS

Understanding that the drawings depict only exemplary embodiments and are not therefore to be considered limiting in scope, the exemplary embodiments will be described with additional specificity and detail through the use of the accompanying drawings, in which.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, software, mechanical, and electrical changes may be made. Furthermore, the methods presented in the drawing figures and the specification are not to be construed as limiting the order in which the individual acts may be performed. The following detailed description is, therefore, not to be taken in a limiting sense.

Figure 1:
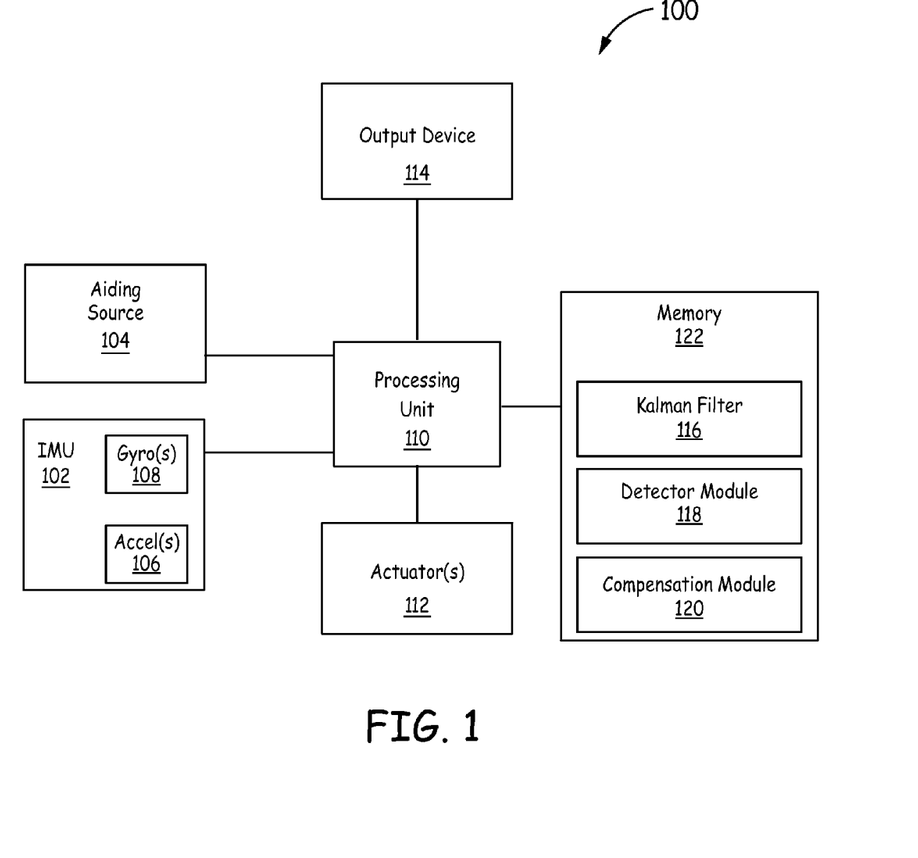
FIG. 1 is a block diagram of one embodiment of an exemplary navigation system.

In FIG. 1, navigation system 100 includes instruments to perform measurements and calculations of navigation parameters such as position, velocity, acceleration, and rotation rate. For example, system 100 includes an Inertial Measurement Unit (IMU) 102 and an aiding source 104. The IMU 102 typically includes a plurality of accelerometers 106 to measure the acceleration along three orthogonal axes or directions (e.g. X, Y, Z, or U, V, W). There are also multiple gyroscopes 108 configured to sense angular rotation of about the three axes X, Y, Z. The IMU 102 may also optionally include a plurality of magnetometers which measure inertial acceleration. Hence, the IMU 102 provides measurements of angular and linear acceleration from which navigational states such as position, velocity, and attitude, etc. can be calculated. Without any loss in generality and for simplicity sake, the discussion below focuses on the acceleration measurements even though there are numerous types of inertial data other than acceleration. Thus, although reference is made to accelerometers, the methods and system can also apply to other sensors and measurements.

In this embodiment, the IMU 102 is implemented as a strapdown unit using solid state sensors. However, it is to be understood that any IMU configured to measure linear motion along a plurality axes and/or rotational motion about the plurality of axes can be used. For example, the IMU can be used, in some embodiments, to measure motion of a host vehicle on which the IMU is located. The aiding source 104 also provides data regarding position, velocity, acceleration, and/or rotation rate. For example, the aiding source 104 can be implemented as a Global Navigation Satellite System (GNSS) receiver, gravity sensor, altimeter, and/or magnetic compass, etc. Furthermore, in some embodiments, more than one aiding source is used.

The IMU 102 and the aiding source 104 provide data to a processing unit 110. The processing unit 110 can include any form of electronics or opto-electronic circuits such as digital signal processors (DSPs), central processing units (CPUs), micro-controllers, and arithmetic logic units. The processing unit 110 is configured to execute software instructions to process the data received from the IMU 102 and the aiding source 104. For example, the processing unit 110 is configured to calculate navigation states, such as geographic location, velocity, and/or orientation (e.g. pitch, roll, and/or yaw) of a vehicle in which the navigation system 100 is located. In addition, in some embodiments, the processing unit 110 outputs commands to one or more actuators 112 to adjust motion of the vehicle in which the navigation system 100 is located. For example, in an aircraft, such as an unmanned aerial vehicle (UAV), the actuators 112 can be implemented as wing flaps, throttle, etc. to adjust the motion of the UAV based on commands from the processing unit 110.

In addition, the processing unit 110 can output data to an output device 114 to provide the data to a user. For example, the output device 114 can be implemented as a printer or display device. The display device can be implemented as any suitable display device, such as but not limited to a cathode ray tube (CRT) display, an active matrix liquid crystal display (LCD), a passive matrix LCD, or plasma display unit.

The processing unit 110 is also configured to execute a Kalman filter 116, a detector module 118, and a compensation module 120 in processing the data received from the IMU 102 and aiding source 104. The Kalman filter instructions 116, the detector module instructions 118 and the compensation module instructions 120 are stored on a memory 122. Although the detector module 118 and compensation module 120 are implemented using software instructions in this example, it is to be understood that, in other embodiments, the detector module 118 and the compensation module 120 can be implemented using hardware circuit elements. The memory 122 can be implemented as any appropriate computer readable medium used for storage of computer readable instructions or data structures.

The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk—Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The Kalman filter 116 blends measurements from the IMU 102 and the aiding source 104 to estimate current state variables along with their uncertainties. In addition, the Kalman filter 116 recursively updates estimates using a weighted average, where estimates having higher certainty are weighted more heavily than other estimates with more uncertainty. The detector module instructions 118 causes the processing unit to detect unexpected higher frequency events such as vibrations due to shock events or due to acoustic noise that accompany, for example, explosions or jackhammering. As further examples, an aircraft may encounter an air front or receives a lightning strike; a submarine may hit a reef; or a missile may traverse a battle bombing zone. Such events may cause the vehicle to suddenly move up and down, swerve or vibrate, i.e. to accelerate. Such vibration may translate to rapid changes in the magnitude of the accelerometer's measured acceleration, and changes in its DC bias value. These vibrations may cause instruments like accelerometers 106 or an oscillator of a GNSS to output incorrect measurements or data. After a vibration or high frequency event is detected with detection module 118, compensation module 120 compares the new DC values with pre-determined threshold settings that are indicative of the magnitude of the high frequency vibrations.

The detection module 118 isolates high frequency events from normal events. For example, planned maneuvers such as when an aircraft banks and lands, or when a submarine or missile releases its own bombs may also cause the accelerometer to measure some deviations in the magnitude of the acceleration. However, the planned maneuvers are usually of a lower rate, i.e. causing a lower frequency event, as compared to disturbances, such as turbulence for an aircraft. Consequently, the detection module 118 is configured to distinguish particular high frequency disturbance situations that have been characterized through vehicle or flight tests from maneuver inputs.

Based on an output from the detection module 118, the compensation module 120 informs the Kalman filter 116 how to correct for the effects of the high frequency disturbances, causing the Kalman filter 116 to properly weight certain estimated state errors and uncertainties associated with the disturbance, resulting in a system output consistent with the input. For instance, the weight may be reduced during a disturbance event.

Other types of events can also be detected and corrected if desired. For example, if detection module 118 is configured to distinguish and process the high frequency events, it also segregates out the lower frequency events. The compensation module 120 can be correspondingly configured to provide results to correct the Kalman filter 116 for the lower frequency events also. In order to configure the detection modules 218 and compensation module 120 for the lower frequency events, the bandwidth and threshold parameters that govern detection module 118 and compensation module 120 can be modified or separate low frequency bandwidth and threshold parameters can be used. These parameters are reconfigurable as described below.

Figure 2:
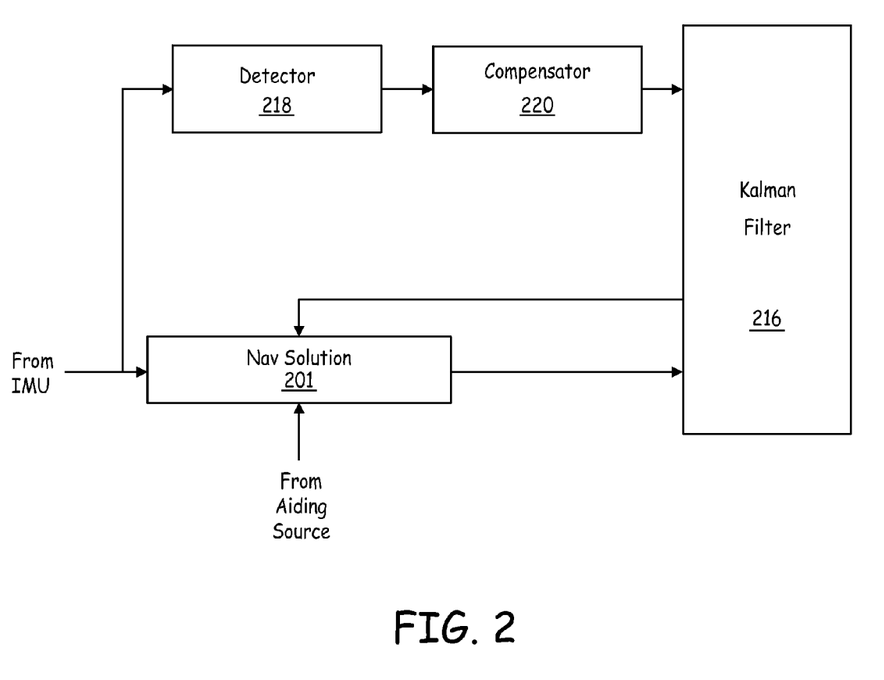
FIG. 2 is an exemplary data flow diagram depicting data flow of one embodiment of a navigation system.

FIG. 2 is a data flow diagram depicting data flow of a navigation system such as system 100 above. In FIG. 2, IMU data and data from an aiding source are used by the Kalman filter 216 to estimate a current navigation solution 201. That is the data from the IMU and the data from the GNSS receiver are used to obtain position, velocity, timing, heading, etc. The data from the IMU and aiding source are also input to the Kalman filter 216. For example, in some embodiments, the raw measurements from the IMU and the GNSS receiver can be input to the Kalman filter 216. In other embodiments, the data is pre-processed prior to being input to the Kalman filter 216. Additionally, the current navigation solution 201 can be input to the Kalman filter 216 in some embodiments. A copy of the data from the IMU is also provided to the detection module 218 (also referred to herein as a detector, detector module, or disturbance detection module). For example, the raw acceleration measurements are fed or sampled or clocked into the disturbance detection module 218.

As discussed above, the detector 218 identifies high frequency disturbance situations based on the data from the IMU. The detector 218 outputs a value to the compensation model 220 representative of the high frequency disturbance situations. Based on the output from the detector 218, the compensation module 220 calculates inputs to the Kalman filter to adjust the error states and weights applied to the inputs to the Kalman filter.

In particular, the compensation module 220 checks the magnitude of the DC level output of the detector module 218 indicating a certain disturbance level. A change in the DC level detector module output corresponds to fluctuations in system state errors such as accelerometer sensor bias. For example, rapid changes in the disturbance level of a host vehicle can induce rapid shifts in sensor errors which should be accounted for. In the compensation module 220, DC level voltage shifts are compared with various threshold levels that are indicative of whether more or less vibration is occurring. Then the compensation module 220 outputs a navigation correction signal that informs a Kalman filter to increment the process noise of the relevant states associated with high frequency events. For instance, the process noise associated with accelerometer bias states could be adjusted.

The magnitude of the threshold settings and amount of compensation are set, in some embodiments, based on a priori characterization of each particular measurement instrument, such as the accelerometers, under various types of conditions. The threshold settings and amount of compensation are also determined based on the intended application and details of the Kalman filter module being implemented. For example, if more variables are included, such as the accelerometer DC bias plus the gyroscope DC bias, the threshold settings and amount of compensation may be different from embodiments in which only accelerometer measurements are used.

In this example, the input to the compensation module 220 received from the detection module or detector 218 comprises a DC-level value. The compensation module 220 can be implemented with a comparator circuit configured to have hysteresis. The comparator circuit compares the DC-level value with pre-determined thresholds so that if the DC-level value surpasses (exceeds or falls below) a given threshold, the output of the comparator circuit indicates the DC-level value is too high or too low accordingly. The output of the comparator circuit of the compensation module 220 provides a signal to a Kalman filter to adjust the process noise associated with the state variables related to the high frequency disturbance input such as measured by the corresponding sensors. Based on the outputs from the compensation module 220, the Kalman filter calculates and outputs corrections to the navigation solution 201. Additional details regarding the detector 218 are described in more detail below.

Figure 3:
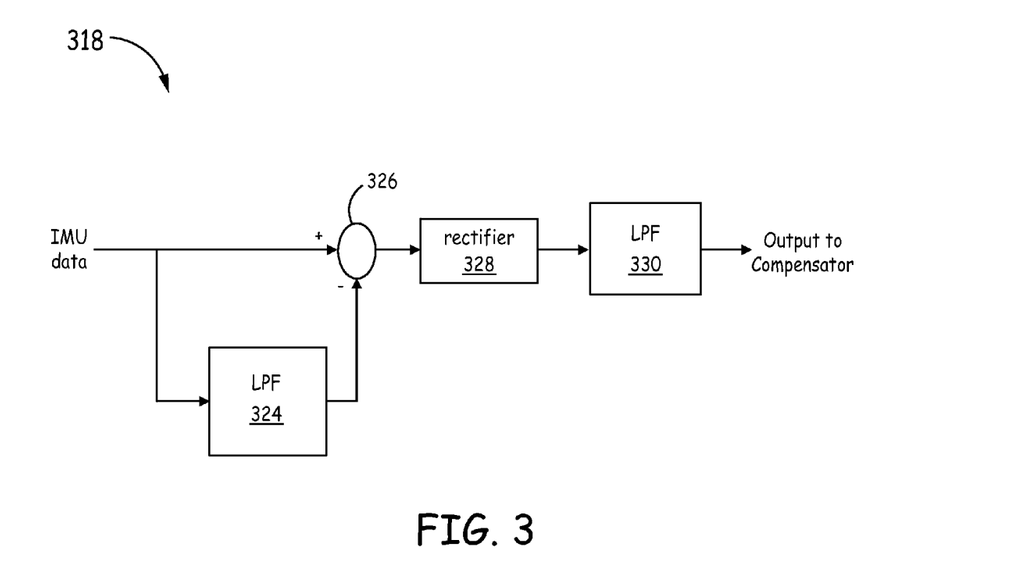
FIG. 3 is a block diagram of one embodiment of an exemplary disturbance detection module.

FIG. 3 illustrates one embodiment of a disturbance detection module 318 that receives raw inertial data from the sensors, such as accelerometers in an IMU. Detection module 318 has a low pass filter 324 that is coupled to a summer 326. The output node of summer 326 is coupled to the input of a rectifier 328. The output node of the rectifier 328 goes into a second low pass filter 330 that provides an output. The second low pass filter 330 is a level converter that converts a varying input signal to a DC level output, or smoothes out high frequency inputs and outputs a signal that is closer to a DC level. The DC level may still have small fluctuations, but they are gradual and slowly varying with noise. In one embodiment, where the rectifier 328 is implemented as a squaring function, the output is a squared root mean square (RMS) value. For raw output that is a squared RMS value, the square root of the output or the root mean square (RMS) is also available as an output that goes to a compensation module. Because detection module 318 can provide a Mean Square (MS) output, it is sometimes referred to as the MSD (mean square detector), below.

In some embodiments, the example of FIG. 3 is implemented as electronic circuits, e.g. an analog low pass filter 324, if the inertial raw data is provided in analog form from an IMU. Alternatively, an IMU generates digital outputs, in other embodiments, that are sampled, latched, and passed to the detection module 318 that is implemented as a digital circuit in such embodiments. Yet another alternative is that detection module 318 is implemented as a software module having digital filters that are executed in a processor, as described above with respect to FIG. 1.

In embodiments in which the disturbance detection module 318 implemented as a digital circuit or software instructions, in order to detect higher frequency events such as vibrations or acoustic noise, the sampling frequency should be high enough to properly detect any rapid changes in the measured raw acceleration of interest from the accelerometer 28. The disturbance detection module 14 should sample at, at least the Nyquist rate or at least twice the highest frequency contained in the disturbance frequency of interest. For aircraft navigation, the sampling frequency is often over 100 Hz, but the sampling frequency is a configurable value to accommodate other situations.

In the example of FIG. 3, the summer 326 takes the raw inertial data and subtracts off the low frequency content of the raw inertial data that the low pass filter 324 provides to the summer 326. Then, only the high frequency part of the raw inertial data remains at the output of the summer 326. For example, rapid changes in acceleration of a host vehicle may be reflected as induced, rapid bias voltage shifts in the inertial data. A priori system characterization helps in determining the bandwidth of the rapid voltage shifts and other characteristics used to configure the low pass filter, as well as whether to implement the low pass filter as a first order low pass filter, a Butterworth filter, a Chebyshev filter, etc.

Once the low pass filter 324 is configured with the desired cutoff frequency, the filter 324 preserves those lower frequency signals that are input to the negative input of the summer 326. The measurement results due to lower frequency disturbances or planned maneuvers are subtracted off by the summer 326, leaving only the measurements due to higher frequency events. In another embodiment, the bandwidth of the low pass filter 324 is dynamically configurable rather than a predetermined fixed cutoff frequency.

For a digital filter implementation, a parameter that is equivalent to the bandwidth is the response time to an impulse signal, the time constant $\tau$. The value of the time constant $\tau$ depends on the rate at which the inertial navigation data is retrieved. For example, in some embodiments, the time constant $\tau$ is set in the range of 0.05 to 0.2 seconds. The time constant $\tau$, like the bandwidth, can be set based on the characteristics of the expected disturbance events and the expected characteristics of typical and planned maneuvers. For example, the higher frequency vibrations or sudden vehicle movements can be preserved at the output of summer 326 by an appropriate choice of $\tau$. By contrast, with an appropriate choice of $\tau$, the planned and/or slow maneuvers of the host vehicle are substantially eliminated at the output of summer 326 such that they are not included in subsequent analysis.

In the embodiment of FIG. 3, the output of summer 326 feeds the rectifier 328, which can be a squaring function, so that both negative and positive signals are squared and thus are treated alike in the subsequent analysis. That is, only the magnitude is taken into account and not the sign. The output of rectifier 328 passes to another low pass filter 330 that converts the measurement of the vibration or disturbance into an equivalent DC voltage value or a particular DC numeric value that is representative of the magnitude of the disturbance at a given time point. If the magnitude or frequency of vibration event changes, the associated DC level will also change in magnitude, and the output value would reflect this change. In some embodiments, the bandwidth of the low pass filter 330 is fixed a priori. In other embodiments, instead of fixing the bandwidth of the low pass filter 330, the choice of the bandwidth of the filter 330 is dynamically configurable.

Figure 4:
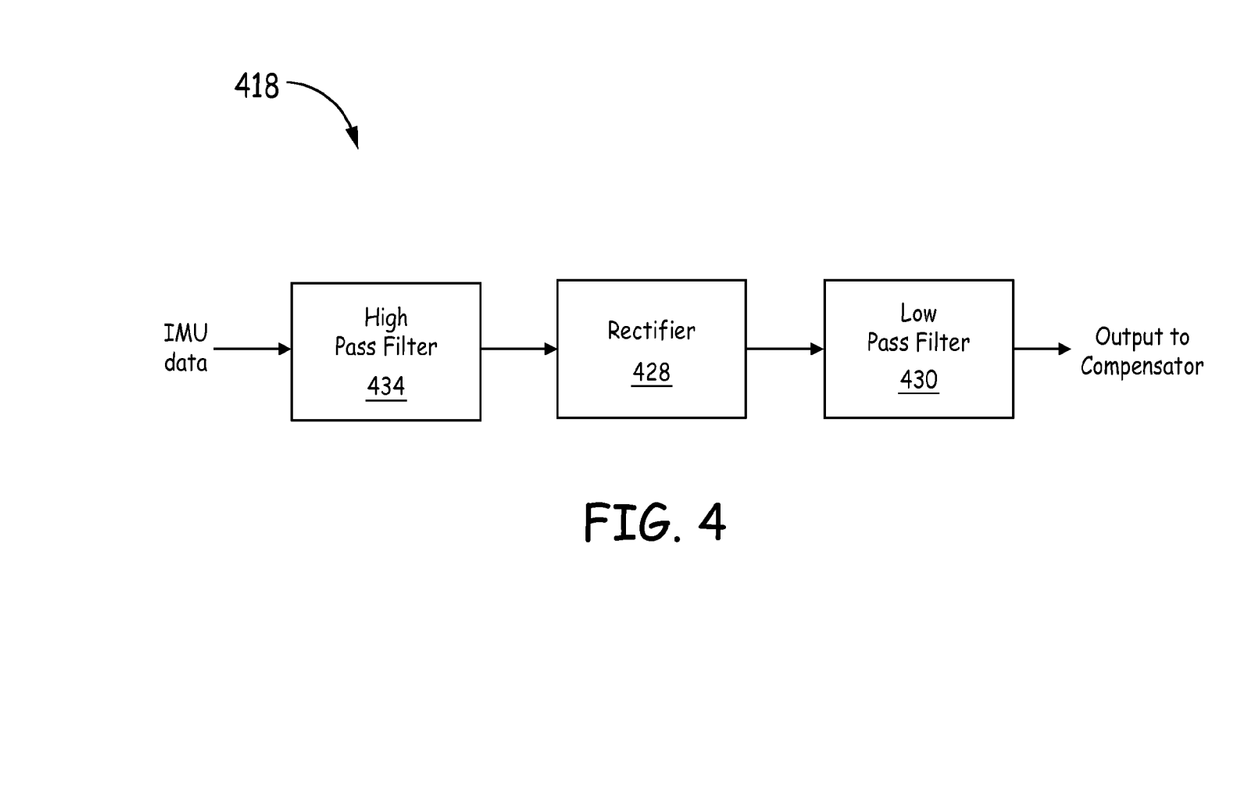
FIG. 4 is a block diagram of another embodiment of a disturbance detection module.

FIG. 4 depicts another exemplary embodiment of a disturbance detection module 418, where a high pass filter 434 is employed. Filter 434 isolates the higher frequency disturbances or vibrations directly rather than through the use of a summer to subtract off the lower frequency disturbances as in the example of FIG. 3. Rectifier 428 converts both negative and positive signals so that they are treated alike. The output of rectifier 428 passes to another low pass filter 430 that converts the measurement of the disturbance into an equivalent DC value that is representative of the magnitude of the disturbance. If the rectifier 428 is a squaring function, the output values are provided in units such as $grms^2$ and/or $grms$. In one embodiment, the respective bandwidths of the filters 434 and 430 are determined a priori. In another embodiment, the respective bandwidths of the filters 434 and 430 are dynamically configurable. Additionally, in one alternative embodiment, the rectifier 428 is implemented as an absolute value module so that both negative and positive signals are treated alike, but not squared.

Figure 5:
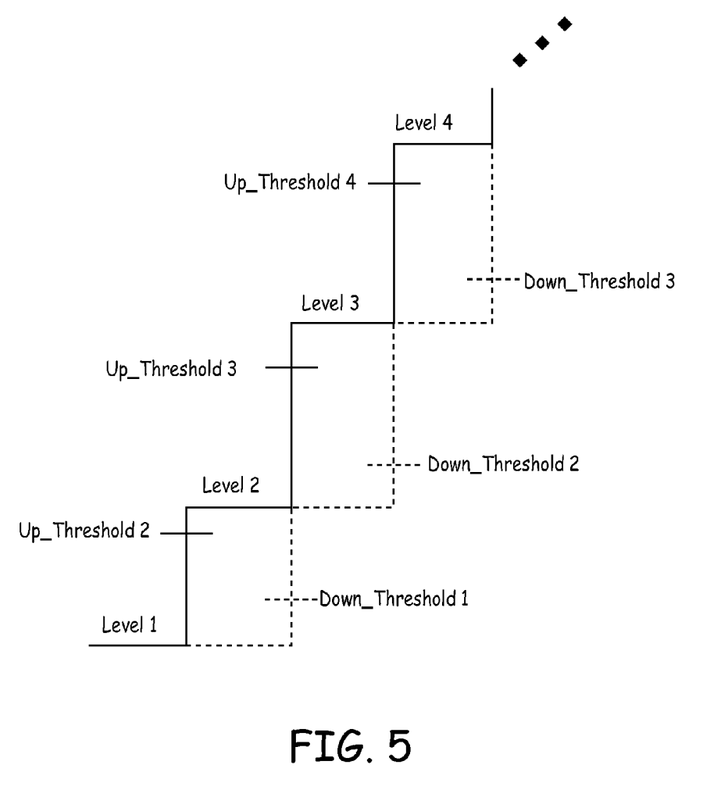
FIG. 5 depicts one example of hysteresis of a comparator in an exemplary compensation module.

FIG. 5 depicts one example of the hysteresis of a comparator in an exemplary compensation module, such as compensation module 220. In FIG. 5, the DC-level value from the output of a detection module is compared with threshold values that are associated with a particular process noise increment value (also referred to as a compensation value). The process noise increment values instruct a Kalman filter to "bump" the process noise of states related to the high frequency events. The result of bumping the process noise is to adjust the relevant state errors associated with the high frequency event that are estimated by the Kalman filter. The process of adjusting the process noise values is called a "Qbump" and is used to assign weighted errors to the relevant states affected by the high frequency event.

In the example of FIG. 5, four process noise increment levels are shown. However, it is to be understood that fewer or more than four levels can be used in other embodiments. The process noise increment levels are labeled Level 1, Level 2, Level 3, and Level 4 and are also referred to herein as threshold levels or vibration threshold levels. Each level is associated with a corresponding Qbump or process noise increment value. The corresponding Qbumps are referred to herein as Qbump1, Qbump2, Qbump3, and Qbump4. Each level is also associated with a corresponding Up_Threshold and a corresponding Down_Threshold. The Up-Thresholds are used when the input DC level is increasing to determine when to shift the current threshold level to the next higher level. The Down_Thresholds are used when the input DC level is decreasing to determine when to shift the current threshold level to the next lower level. For example, if the current level is level 1 and the DC level is increasing, the current level is increased to level 2 when the DC level exceeds the Up_Threshold 2. However, the current level is not decreased to Level 1 until the DC level decreases below the Down_threshold 1. Hence, the Up_Thresholds and Down_Thresholds help determine whether the DC-level value is going upwards or downwards and also take hysteresis into consideration.

When the thresholds are triggered, there are numerous ways to keep track of what is occurring and what action to then take. Different embodiments include setting condition-flags or jumping out of the loop and moving onto the next comparison. For instance, the software or the circuit could be set such that if there are three measurements for accelerometers, corresponding to the three directions (X, Y, Z) or (U, V, W), once the threshold condition is reached for one of the axes, then the compensation module can send a compensation bump value (Qbump) to the Kalman filter for that individual axis. Alternatively, once the threshold condition is reached for one of the axes, the compensation module can send a Qbump to the Kalman filter for all of the axes. There are numerous possibilities and numerous ways to implement the comparisons, both in software or in circuitry.

Based on a priori characterizations, the magnitude of the up and down thresholds may be centered about the corresponding level value, but they need not be centered and symmetric about the corresponding level. That is, it is not necessary to preserve this symmetry and to set the thresholds symmetrically. For example, sometimes the onset of a vibration condition may be more rapid or less rapid than when the vibration dampens. For example, the magnitude of the downward going threshold may be set farther from the corresponding level values than the magnitude of the upward going threshold, or vice versa. This is sometimes useful to account for the noise level on the output 110 of the detector 14. Additionally, each of the level values need not be set symmetrically. For example, the difference between Level 1 and Level 2 may be set differently from the difference between Level 2 and Level 3.

Hence, the use of separate thresholds to increase (Up_Thresholds) and decrease (Down_Thresholds) the Qbump level introduces hysteresis to avoid undesirable fluctuating conditions when the vibration induced DC bias shift may be fluctuating about a threshold. Such fluctuations may be due to electronic noise or the DC-level value being just on the cusp of one of the threshold values. The hysteresis prevents rapid switching between two levels due to such fluctuations.

When the threshold values are triggered, the compensation module sets a "Qbump" as discussed above. The Qbumps are variance magnitude values that are passed to the Kalman filter so that the state estimation errors associated with the disturbance event can be scaled. For instance if the accelerometer measurement triggers Up_Threshold 3, Qbump3 is sent to the Kalman filter. For each threshold, there is a Qbump value that is provided to the Kalman filter. The Qbump values may be selected based on a characterization of the sensor suite used by the applications in the Kalman filter. In some embodiments, if there is no disturbance or at initialization, the Qbump values are set to zero so that the Kalman filter does not make any adjustments based on the detection module and compensation module. Likewise, if a magnitude of Qbump is not defined for an application in the Kalman filter, a default value which effectively disables the threshold can be set, in some embodiments. Finally, in yet another embodiment, the Qbump magnitude is a programmable value for each level as well as for each defined state in the Kalman filter that is affected by a disturbance event.

In another embodiment, the compensation module performs additional tasks or even passes additional parameters to the Kalman filter. The detection module can optionally check how much time it has taken to establish an initial (or subsequent) vibration threshold level. For instance an average time to establish the threshold level can be set based on a priori testing and simulations. In other embodiments, if an average time is not defined, a default time may be used that is configurable. The averaging time, related to the time required to determine an initial threshold level, can be another variable that is set dynamically in some embodiments. An initial threshold level can be set in order for the Kalman filter to reach a stable initial state from which to make subsequent computations.

In yet other embodiments, various other configurable parameters can be utilized by the detection module and/or the compensation module. Although four levels are shown in FIG. 5, the number of threshold settings or the threshold levels can be set dynamically in some embodiments. Additionally, Qbump values are also configurable in some embodiments. For example, the Qbump value for each state vector and threshold level can be configurable. If the states are multi-dimensional or have three axes, an individual Qbump value for each axis is also configurable in some embodiments.

In yet another embodiment, delta changes in the Qbump is another parameter that can be set by a user or at manufacture. In some embodiments, the compensation module is configured to calculate parameters such as a delta measurement noise standard deviation coefficient. For example, in some embodiments a limit is placed on the measurement noise standard deviation delta which may prevent a radical state error estimate change. The value chosen for the limit and the delta noise depends, in some embodiments, on the value of the filter coefficients and on the disturbance level output out of the disturbance detection module.

Figure 6:
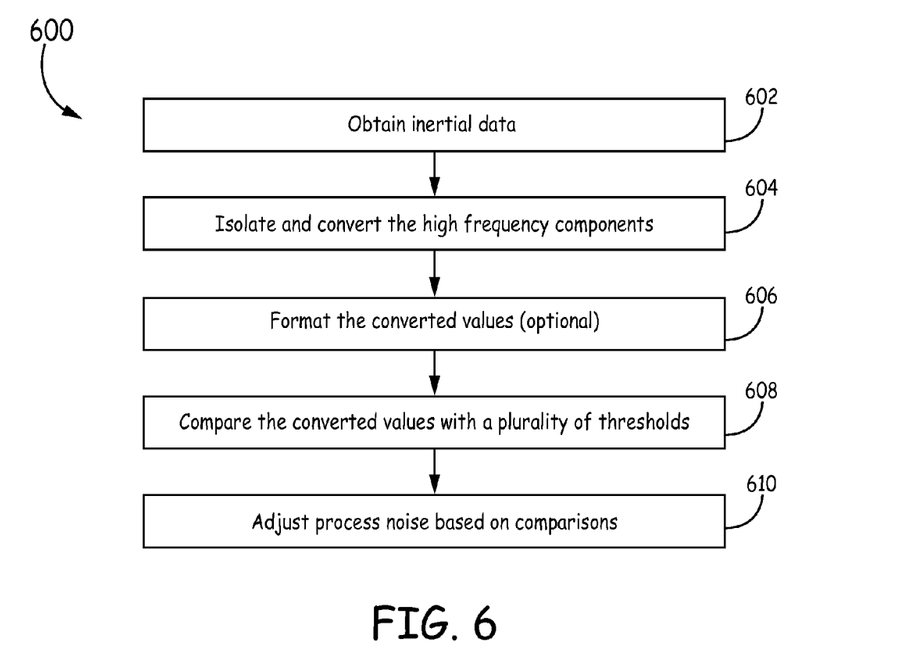
FIG. 6 is a flow chart of one embodiment of a method of detecting disturbance and providing compensation.

FIG. 6 is a flow chart of one embodiment of a method 600 of detecting high frequency disturbances and compensating for bias shifts due to such disturbances. In block 602, a disturbance detection module obtains or samples the raw inertial data such as accelerometer measurements. In block 604, the detection module monitors and reports the magnitude of the disturbance, such as a vibration, by isolating the high frequency components of the inertial data and converting the high frequency components to a DC-level value that represents the magnitude of the disturbance or the changes in the disturbance. As used herein, the term "high frequency" refers to frequencies above a predetermined frequency level. If there are multiple dimensions, the monitoring may be performed for each axis (X, Y, Z) that is measured by one of the three accelerometers, gyroscopes, etc.

In block 606, the isolated high frequency disturbance is associated with a voltage or bias value. This value is put into a format that is compatible with the comparator in the compensation module. For example, if the voltage or bias value is a negative value, this is turned into a positive value in some embodiments. Additionally, in some embodiments, if the value is fluctuating, then it is filtered so that its DC content is preserved. In block 608, a disturbance or vibration compensation module analyzes the DC-level values provided by the disturbance detection module. The values are compared with thresholds to determine whether to increment the process noise of select states of the Kalman filter that are affected by a high frequency disturbance. For example, in some embodiments, the DC-level values are compared with a first plurality of thresholds, which indicate an increasing disturbance level, to determine when to increase the current threshold level and increment the process noise. The DC-level values are also compared to a second plurality of thresholds, which indicate a decreasing disturbance level, to determine when to decrease the current threshold level and increment the process noise.

In block 610, if the DC level values trigger certain threshold levels, as discussed above, then a corresponding QBump signal is generated by the compensation module to increment or adjust the process noise by a particular amount depending on which threshold level was triggered. In some embodiments, the Qbump is set on a per axis basis. In an alternative embodiment, the Qbump is set based on results from a combination of axes (e.g. two or more, or all three axes, u, v, w, triggers bumping the errors by a corresponding Qbump). In another embodiment, a Qbump is triggered for all axes based on a trigger from a single axis, which causes a quicker response time of the system to the errors caused by the high frequency disturbance.

Figure 7:
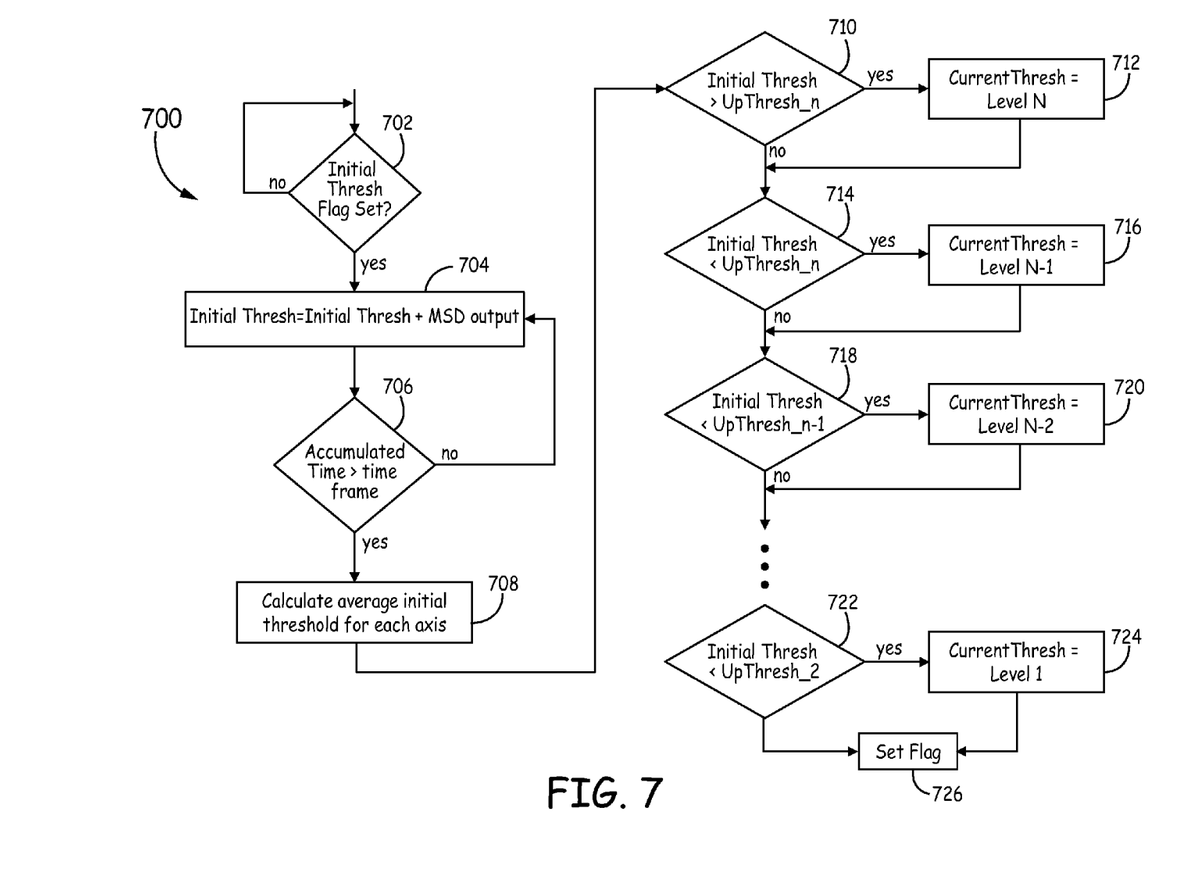
FIG. 7 depicts a flow chart of one embodiment of a method for initializing the compensation module.

In some embodiments, state machines are used to perform initialization of the compensation module. For example, FIG. 7 is a flow chart of one embodiment of a method 700 for initializing the compensation module to compensate for DC bias shifts induced by high frequency events. The method 700 implements a Threshold Initialization state machine that establishes the initial vibration conditions (referred to as "initial_threshold") and sets a value called CurrentThresh in a compensation module which represents the current threshold level. Each threshold level is associated with a process noise increment. Hence, the current threshold level is also referred to as a process noise increment level. Hence, method 700 determines an initial threshold level as described below. If there are multiple accelerometers, such as in three dimensions, (u, v, w), there are multiple state machines in some embodiments, each state machine corresponding to one of the dimensions. The initialization state machine can be run under various scenarios. For example, the initialization state machine can be run when a vehicle, such as an aircraft, first starts and the vehicle operator turns on the equipment for high frequency event detection and compensation. Alternatively, the initialization state machine can be run or re-run if the vehicle has been operating a while and the equipment is turned on, or if the equipment for high frequency event detection and compensation is switched from a mode that no longer detects and tracks the high frequency environment to a mode that detects and tracks the high frequency environment.

At block 702, an initialization flag is checked. The initialization flag indicates whether or not the initialization state machine should be run or not. In this example, if the flag is set to "yes" then the rest of method 700 is performed. For example, the initialization flag could be set to "yes" when the detection/compensation equipment is turned on or coming out of a mode that does not track the high frequency environment. If the flag is set to "no," then the rest of method 700 is not executed.

If the initialization flag is set "yes," then the method 700 continues to blocks 704 and 706, where an accumulation is performed over some time duration. In particular, at block 704, the initial threshold value is set equal to the initial threshold value plus the current DC level value out of the Mean Square Detector (MSD output of the detection module). At block 706, it is determined if the time duration (referred to as averaging time in FIG. 7) has been exceeded. If the time duration has not been exceeded, method 700 returns to block 704 where the initial threshold value is again set equal to the initial threshold value plus the current DC level value output. Hence, in this manner, successive values out of the MSD are periodically summed at block 704 so long as the time duration is not yet exceeded. For example, the value of the initial threshold starts out at zero or some base value initially. Then, the current initial threshold value is the sum of the previous initial threshold value and the new output of the MSD. The recursive summation keeps continuing until the time limit for summing the successive values from the MSD has been exceeded.

Once the time interval exceeds the time limit at block 706, then method 700 moves to block 708 where the averaging is performed. In particular, the final value of the sum from block 704 is divided by the time interval over which the successive values were summed. Thus, the last value of initial threshold is divided by the time interval to get an average initial threshold value for one accelerometer. Method 700 can be repeated for each accelerometer for each axis, or for as many accelerometers there are onboard a vehicle.

After obtaining an average initial threshold value at block 708, the method 700 continues at block 710 where it is determined if the average initial threshold value is greater than the Up_Threshold associated with the highest threshold level (i.e. Up_threshold N, where N is the highest level). For example, if there are 4 levels, as in the embodiment of FIG. 6, then Up_Threshold N is equal to Up_Threshold 4. If the average initial threshold value is greater than Up_Threshold N, then the current threshold level is set to Level N at block 712.

Method 700 then continues at block 714 where it is determined if the average initial threshold value is less than Up_Threshold N. If the average initial threshold value is less than Up_Threshold N, then the current threshold level is set to the next lower threshold level, Level N−1, at block 716.

At block 718, the average initial threshold value is compared to the Up_Threshold associated with the next lower threshold level, Up_Threshold N−1. If the average initial threshold value is less than Up_Threshold N−1, then the current threshold level is set to the next lower threshold level after Level N−1 (i.e. Level N−2) at block 720. This procedure continues until the initial threshold value is compared to Up_Threshold 2 associated with threshold Level 2 at block 722. If the initial threshold value is less than the Up_Threshold 2, the current threshold level is set to Level 1 at block 724. At block 726, the initial threshold flag is set to "no" so that the initialization is not executed again until the flag is set back to "yes". Thus, the current threshold level is the initial threshold level (also referred to as initial process noise increment level).

Figure 8:
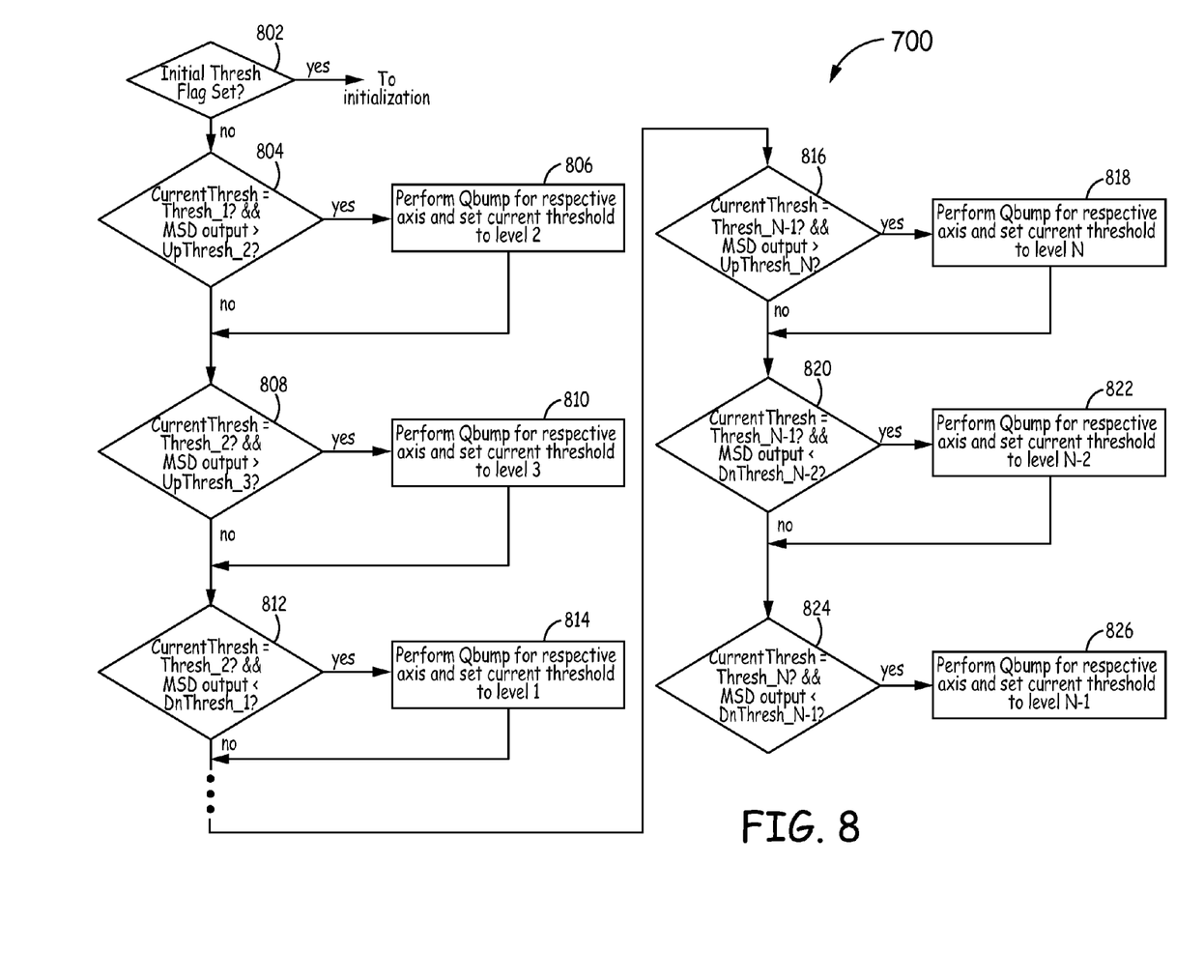
FIG. 8 is a flow chart of one embodiment of a method implementing a state machine for providing compensation after initialization.

FIG. 8 is a flow chart of one embodiment of a method 800 implementing a state machine for providing compensation after initialization, such as the initialization in method 700, is performed. Compensation includes checking and updating the current threshold level, CurrentThresh, to the appropriate threshold level to respond to vibration environment changes. The changes are triggered after comparing the MSD output values with the pre-determined threshold levels, then setting an appropriate Qbump value to pass to the Kalman filter. In some embodiments, the method 800 is run continuously after the equipment is turned on or after the equipment leaves a mode that no longer detects and tracks the high frequency environment. When run, method 800 polls the present value of CurrentThresh and the MSD output value. The frequency with which the CurrentThresh and MSD output values are polled can vary based on the specific implementation. For instance, exemplary polling frequency values can be between 50 to 200 Hz. Alternatively, the polling frequency is configurable dynamically. In addition, method 800 can be performed for each axis being measured or monitored.

At block 802, it is determined if the initial threshold flag is set to "yes" or "true", indicating that the initialization is still ongoing. If the flag is not set to "true", method 800 proceeds to block 804 where it is determined if the current threshold is equal to threshold Level 1 and if the MSD output values are greater than Up_Threshold 2. If both the current threshold is equal to level 1 and the MSD output values are greater than Up_Threshold 2, the compensation module performs a Qbump associated with Level 2 for the respective axis at block 806. That is, the compensation module causes the Kalman filter to increase the process noise of the relevant states of the respective axis. The current threshold level is also set to Level 2 at block 806.

If the current threshold is not equal to Level 1 or if the MSD output values are not greater than Up_Threshold 2, method 800 continues to block 808. At block 808, it is determined if the current threshold is equal to Level 2 and if the MSD output values are greater than Up_Threshold 3. If the current threshold is equal to Level 2 and the MSD output values are greater than Up_Threshold 3, a Qbump associated with Level 3 is performed and the current threshold is set to Level 3 at block 810. If the current threshold is not equal to Level 2 or the MSD output values are not greater than Up_Threshold 3, method 800 continues to block 812 without performing a Qbump.

At block 812, it is determined if the current threshold is equal to Level 2 and the MSD output values are less than Down_Threshold 1. If the current threshold is equal to Level 2 and the MSD output values are less than Down_Threshold 1, then a Qbump corresponding to Level 1 is performed to adjust the process noise at block 814. The current threshold is also set to Level 1 at block 814. If the current threshold is not equal to Level 2 or the MSD output values are not less than Down_Threshold 1, then method 800 performs checks similar to those preformed at blocks 808 to 814 for each threshold level up to threshold level N−1.

At block 816, it is determined if the current threshold is equal to Level N−1 and the MSD output values are greater than Up_Threshold N. If the current threshold is equal to Level N−1 and the MSD output values are greater than Up_Threshold N, a Qbump associated with Level N is performed and the current threshold is set to Level N at block 818. If the current threshold is not equal to Level N−1 or the MSD output values are not greater than Up_Threshold N, method 800 continues to block 820 without performing a Qbump. At block 820, it is determined if the current threshold is equal to Level N−1 and the MSD output values are less than Down_Threshold N−2. If the current threshold is equal to Level N−1 and the MSD output values are less than Down_Threshold N−2, then a Qbump corresponding to Level N−2 is performed to adjust the process noise at block 822. The current threshold is also set to Level N−2 at block 822.

If the current threshold is not equal to Level N−1 or the MSD output values are not less than Down_Threshold N−2, then method 800 continues at block 824 where it is determined if the current threshold is equal to Level N and the MSD output values are less than Down_Threshold N−1. If the current threshold is equal to Level N and the MSD output values are less than Down_Threshold N−1, then a Qbump corresponding to level N−1 is performed and the current threshold is set to Level N−1 at block 826. When run, method 800 is repeated continuously for each axis. Hence, method 800 checks whether the MSD output is moving upwards or downwards from the current threshold level for each axis independently. However, in other embodiments, the MSD output value for each axis affects the determination for performing a Qbump on the other axes.

Figure 9:
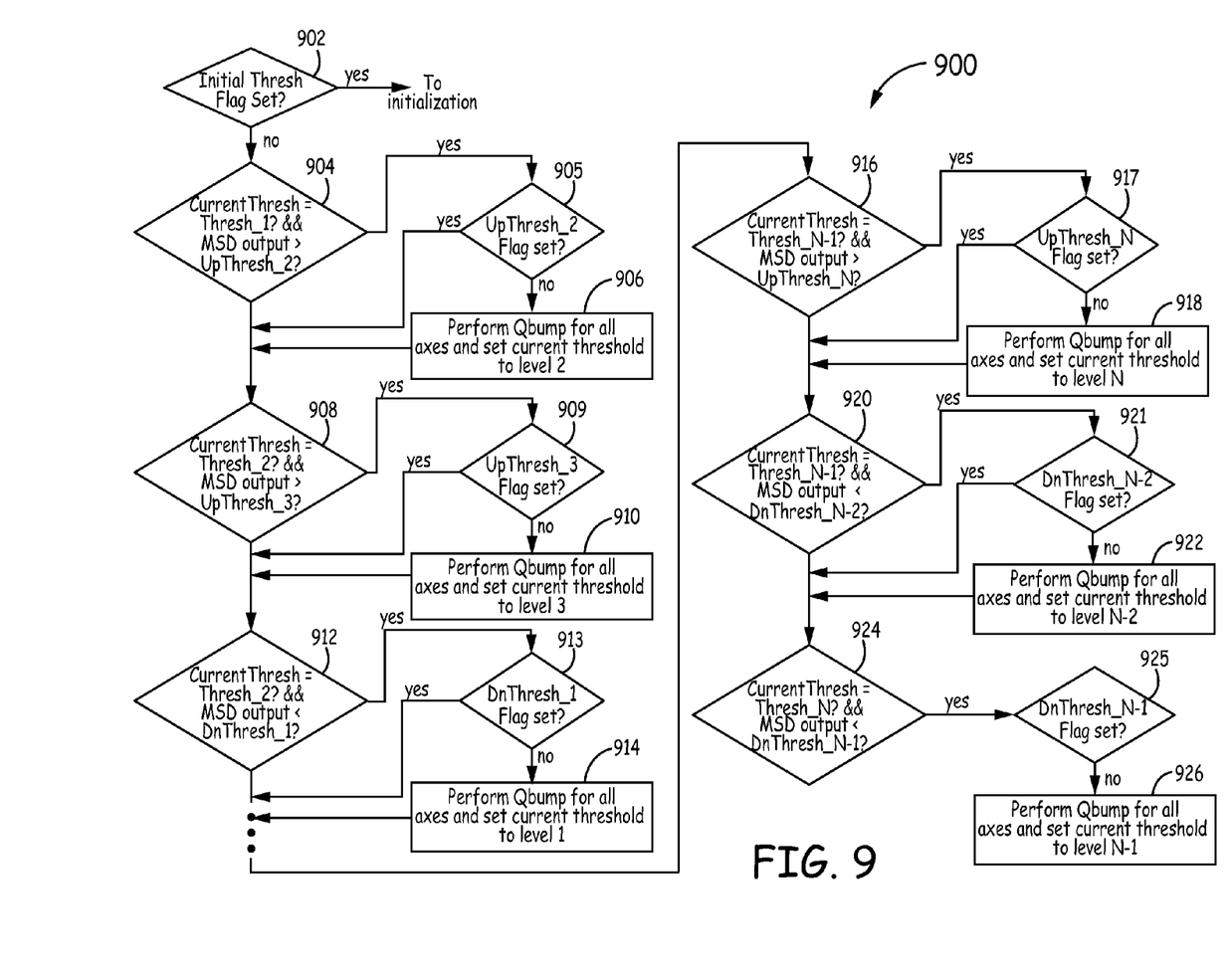
FIG. 9 is a flow chart of another embodiment of a method implementing a state machine for providing compensation after initialization In accordance with common practice, the various described features are not drawn to scale but are drawn to emphasize specific features relevant to the exemplary embodiments.

For example, FIG. 9 is a flow chart of another embodiment of a method 900 implementing a state machine for providing compensation after initialization. Method 900 is similar to method 800 in FIG. 8. For example, at block 904 it is determined if the current threshold is equal to threshold Level 1 and if the MSD output values are greater than Up_Threshold 2 as at block 804 in FIG. 8. However, in method 900, if both the current threshold is equal to level 1 and the MSD output values are greater than Up_Threshold 2, the compensation module performs another check at block 905 to determine if an Up_Threshold 2 flag has been set to 'yes' or 'true'. For example, if another axis has already been analyzed and a Qbump performed for all of the axes based on the other axis, then the Up_Threshold 2 flag should already be set to true. Thus, in order to prevent performing the Qbump associated with Level 2 again, the check at block 905 is performed. If the Up_Threshold 2 flag is set to 'false' or 'no', then method 900 performs a Qbump associated with Level 2 for all of the axes at block 906. That is, the compensation module causes the Kalman filter to increase the process noise of the relevant states of all of the axes. Also at block 906, the current threshold level is set to Level 2 and the Up_Threshold 2 flag is set to 'true'.

Checks similar to the one performed at block 905 are also performed at blocks 909, 913, 917, 921, and 925. Thus, in method 900, a Qbump corresponding to the respective Up and Down thresholds is performed for all of the axes if the respective Up or Down_threshold is crossed on one of the axes. Method 900 prevents duplicate Qbumps when other axes subsequently cross the same threshold through use of an additional check as described above. Other variations can be implemented in other embodiments. For example, in one alternative, a Qbump is performed for all of the axes once a corresponding threshold is crossed for two or more axes. It is to be understood that although a particular polarity, true or false, was selected in describing the decision blocks in methods 800 and 900, the opposite polarity could have just as readily been described in conjunction with reversing the greater than or less than comparisons in the respective decision blocks.

Although specific embodiments have been illustrated and described in this disclosure, it will be appreciated by those of ordinary skill in the art that any arrangement, which is calculated to achieve the same purpose, may be substituted for the specific embodiments shown. For example, it is to be understood that the vibration and compensation system can be utilized in different embodiments and applications that may require tweaking to fit a particular situation and set of electronics. In addition, although the description referred to aircrafts and its acceleration, other variables that are affected by high frequency events can also benefit from the procedure described above. Therefore, it is manifestly intended that these embodiments be limited only by the claims and the equivalents thereof.

What is claimed is:

1. A disturbance correction device comprising:
a disturbance detector configured to detect and output a high frequency component of a measurement signal from an inertial sensor;
a level converter coupled to the output of the disturbance detector, the level converter configured to convert the high frequency component to a direct current (DC) signal;
a compensator coupled to an output of the level converter and configured to compare the DC signal with a plurality of thresholds;
wherein, when the DC signal passes one of the plurality of thresholds, the compensator is further configured to output a respective process noise increment to a Kalman filter, the respective process noise increment corresponding to the passed threshold.

2. The system of claim 1, wherein the disturbance detector comprises a low pass filter and a summer configured to remove low frequency signal from the measurement signal based on a selected bandwidth of the low pass filter.

3. The system of claim 1, wherein the compensator is configure to output a respective process noise increment for each of a plurality of axes when a DC signal associated with one of the plurality of axes passes one of the plurality of thresholds.

4. The system of claim 1, wherein the level converter comprises a low pass filter with a dynamically configurable bandwidth.

5. The system of claim 1, wherein the comparator is configured to compare the DC signal with a first plurality of thresholds associated with increasing levels of the DC signal and with a second plurality of thresholds associated with decreasing levels of the DC signal.

6. The system of claim 1, wherein a bandwidth of the disturbance detector is dynamically configurable.

7. A method of compensating for a disturbance, the method comprising:
isolating a high frequency component of an inertial measurement signal;
converting the high frequency component to a DC-output value;
comparing the DC-output value with a plurality of thresholds; and
incrementing process noise associated with state variables in a Kalman filter that are related to the disturbance based on results of the comparison of the DC-output with the plurality of thresholds.

8. The method of claim 7, wherein comparing the DC-output value with a plurality of thresholds comprises:
comparing the DC-output value with a first plurality of thresholds indicating an increasing disturbance level to determine when to increase a current threshold level and increment the process noise; and
comparing the DC-output value with a second plurality of thresholds indicating a decreasing disturbance level to determine when to decrease the current threshold level and increment the process noise.

9. The method of claim 7, wherein incrementing the process noise comprises incrementing the process noise based on whether the DC-output value is increasing or decreasing.

10. The method of claim 7 further comprising dynamically adjusting a cutoff frequency of a signal frequency filter used to isolate the high frequency component of the inertial measurement signal.

11. The method of claim 7, wherein each of the plurality of thresholds is associated with a respective compensation value; and
wherein incrementing the process noise comprises incrementing the process noise by the respective compensation value when the associated threshold is passed.

12. The method of claim 7 wherein incrementing the process noise comprises incrementing the process noise in the Kalman filter for all axes of an inertial measurement when a DC-output value corresponding to one axis passes one of the thresholds.

13. The method of claim 7, wherein incrementing the process noise comprises incrementing the process noise in the Kalman filter for each axis of an inertial measurement independently of other axes of the inertial measurement.

14. The method of claim 7 further comprising determining an initial threshold level, wherein determining the initial threshold level comprises:

averaging DC-output values over a pre-determined period of time; and comparing the average DC-output value with the plurality of thresholds.

* * * * *